United States Patent
Wang (10) Patent No.: US 8,006,171 B2
(45) Date of Patent: Aug. 23, 2011

(54) APPARATUS FOR RANDOM PARITY CHECK AND CORRECTION WITH BCH CODE

(75) Inventor: Szu-chun Wang, Sinjhuang (TW)

(73) Assignee: Genesys Logic, Inc., Taipei (TW)

( * ) Notice: Subject to any disclaimer, the term of this patent is extended or adjusted under 35 U.S.C. 154(b) by 1034 days.

(21) Appl. No.: 11/844,042

(22) Filed: Aug. 23, 2007

(65) Prior Publication Data

US 2008/0098285 A1    Apr. 24, 2008

(30) Foreign Application Priority Data

Oct. 23, 2006   (TW) ................................ 95218666 U (51) Int. Cl.
*H03M 13/00* (2006.01)
(52) U.S. Cl. .................... 714/782; 714/752; 714/786
(58) Field of Classification Search .................. 714/782, 714/800, 752, 786, 755, 758
See application file for complete search history.

(56) References Cited

U.S. PATENT DOCUMENTS

| | | | |
|---|---|---|---|
| 7,831,895 B2* | 11/2010 | Lin | 714/800 |
| 2007/0253496 A1* | 11/2007 | Giannakis et al. | 375/260 |
| 2008/0028274 A1* | 1/2008 | Lin | 714/752 |
| 2008/0126908 A1* | 5/2008 | Lin | 714/758 |

FOREIGN PATENT DOCUMENTS

TW           1226758         1/2005

* cited by examiner

*Primary Examiner* — Fritz Alphonse (57) ABSTRACT

An apparatus for random parity check and correction with BCH code is provided, including a Bose-Chaudhuri-Hocquenghem (BCH) parity check code encoder, a channel, a BCH parity check code decoder, and a static random access memory (SRAM). The BCH parity check code encoder uses the BCH encoding to encode the parity check code in writing to flash memory. The channel is connected to the BCH parity check code encoder to compute the parity check code and the message polynomial into receiving data. The BCH parity check code decoder is connected to the channel for inputting the receiving data and using BCH decoding to compute the eigen value and error address. The SRAM is connected to the BCH parity check code decoder so as to read error address from static RAM, correct the data and restores the corrected data to the SRAM. Therefore, this achieves the object of random parity check and correction with BCH code.

6 Claims, 6 Drawing Sheets

APPARATUS FOR RANDOM PARITY CHECK AND CORRECTION WITH BCH CODE

BACKGROUND OF THE INVENTION

1. Field of the Invention

The present invention relates to an apparatus for random parity check and correction with BCH code and, more particularly, to an apparatus applicable to flash data writing and capable of BCH encoding and decoding, and random parity checking and correction with BCH code.

2. The Related Arts

Flash memory is widely used in many digital equipments, such as, flash drives, and MP3 players. However, during the writing to the flash memory, it is necessary to perform the parity checking and correction on the codes written to the flash memory to ensure the correctness of the data.

The conventional parity check and correction of the flash memory data access uses the byte-based Reed-Solomon code. The encoder and the decoder of the Reed-Solomon code is more complicated. For example, the encoder includes a parity check unit b(x), generator polynomial g(x), encoding vector v(x), and message u(x), and the relations among them are:

$$g(x) = 1 + g_1 x + g_2 x^2 + g_3 x^3 + \ldots g_{n-k-1} x^{n-k-1} + x^{n-k}$$

$$v(x) = u(x) * g(x)$$

$$v(x) = b(x) + x^{n-k} u(x)$$

$$= b_0 + b_1 x + \ldots b_{n-k-1} x^{n-k-1} + u_0 x^{n-k} + u_1 x^{n-k-1} + \ldots + u_{k_1} x^{n-1}$$

$$= [b_0, b_1, \ldots b_{n-k-1}, u_0, u_1, \ldots u_{k-1}]$$

Figure 1:
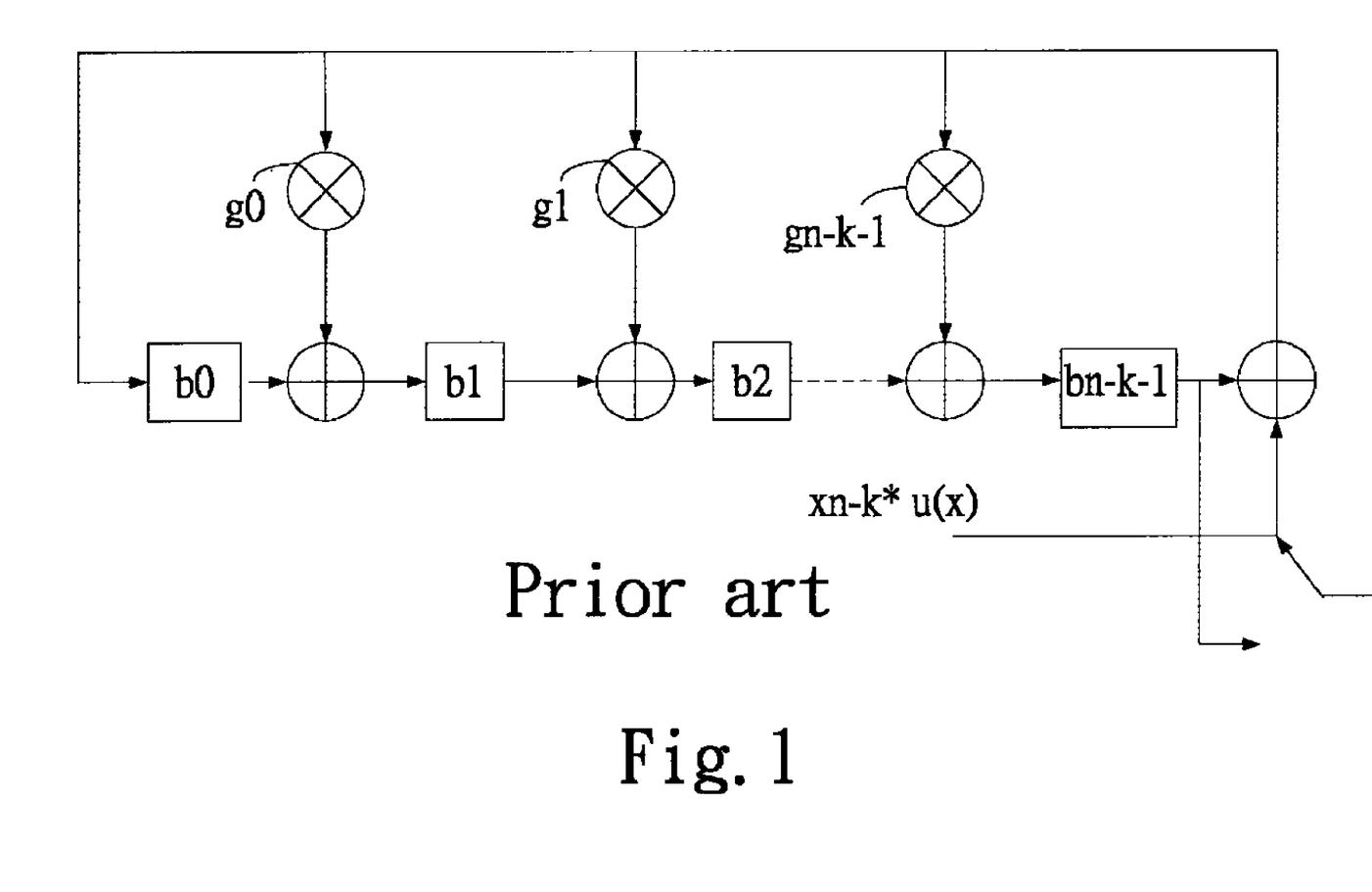
FIG. 1 shows a block diagram of a conventional parity check encoder.

The above polynomial relation ids disclosed as in FIG. 1 of a conventional parity check encoder circuit. The parity check computation units $b_0$-$b_{n-k-1}$ are added, and the generator polynomial units $g_0$-$g_{n-k-1}$ are multiplied. The conventional parity check encoder circuit requires 4096 cycles to shift to the last stage of parity check unit $b_{n-k-1}$. The problem of long computation time is a major drawback of error parity checking and correction.

In addition, the conventional parity check encoder circuit uses Reed-Solomon code for computing the eigen value, error address polynomial, and error address, which requires a longer computing time. Also, the conventional parity check encoder circuit requires at least fourteen 13-bit multipliers and twelve 13-bit adders to accomplish the computation. The circuit is more complex and the manufacturing cost is high.

Taiwan Patent No. 1226758 disclosed an apparatus and method for encoding interleaved periodic code, which is a typical Reed-Solomon code parity check and correction. That is, the disclosed patent also has the drawbacks of long computing time and high hardware cost.

SUMMARY OF THE INVENTION

An object of the present invention is to provide an apparatus for random parity check and correction with Bose-Chaudhuri-Hocquenghem (BCH) code, including the use of BCH encoder for parity check to reduce the computing time and the stages of computing.

Another object of the present invention is to provide an apparatus for random parity check and correction with BCH code, including the use of a BCH decoder to decode the parity check code to reduce the hardware design complexity and cost.

To achieve the above objects, the present invention provides an apparatus for random parity check and correction with BCH code, including a BCH parity check code encoder, a channel, a BCH parity check code decoder, and a static random access memory (SRAM). The BCH parity check code encoder uses the BCH encoding to encode the parity check code in writing to flash memory. The channel is connected to the BCH parity check code encoder to compute the parity check code and the message polynomial into receiving data. The BCH parity check code decoder is connected to the channel for inputting the receiving data and using BCH decoding to compute the eigen value and error address. The SRAM is connected to the BCH parity check code decoder so as to read error address from static RAM, correct the data and restores the corrected data to the SRAM. Therefore, this achieves the object of random parity check and correction with BCH code.

These and other objects, features, and advantages of the invention will be apparent to those skilled in the art, from a reading of the following brief description of the drawings, the detailed description of the preferred embodiment, and the appended claims.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

Figure 2:
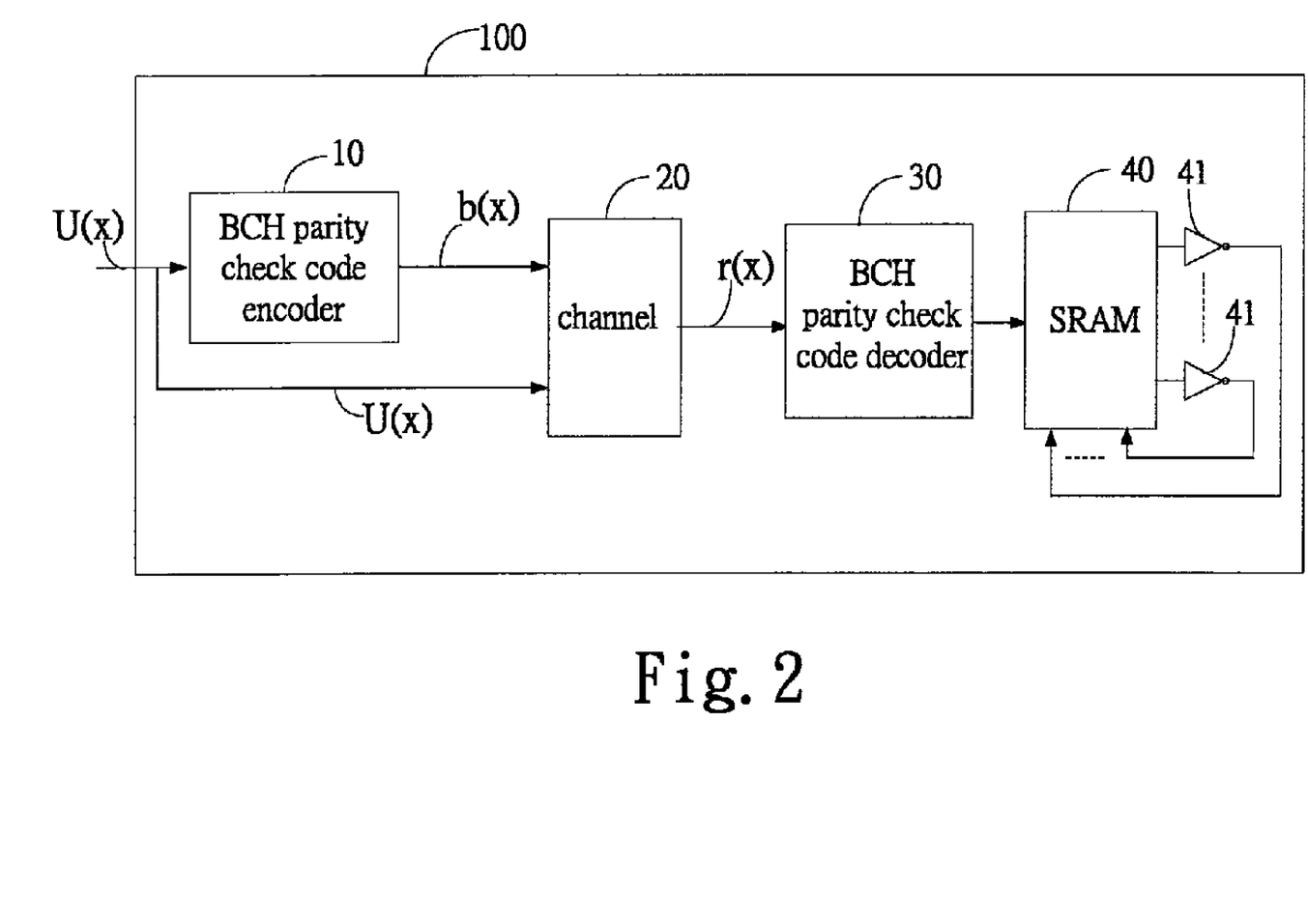
FIG. 2 shows a block diagram of an apparatus of the present invention.

FIG. 2 shows an apparatus 100 for random parity check and correction with BCH code, including a BCH parity check code encoder 10, a channel 20, a BCH parity check code decoder 30 and a SRAM 40. The BCH parity check code encoder 10 uses a BCH code to encode parity check code. The present invention uses BCH(8191, 8139) as an embodiment for description. Other BCH encoding methods are also within the scope of the present invention.

The signals of FIG. 2 include a parity check bit b(x), BCH(8191,9139) generator polynomial g(x), receiving data r(x), and message u(x).

The BCH(8191,8139) generator polynomial g(x) is:

$$g(x) = \{1101,0101,0110,0001,1101,0101,1100,0010, \\ 0000,1100,0100,1010,0010,1\} \quad (4\text{-}1)$$

where g(0)=1, ..., g(51)=0, g(52)=1

The 4096-bit data requires 4096 cycles to each the last stage of the conventional parity check code encoder circuit. That means 4096 cycles in encoding time when using the conventional parity check code encoder. The present invention simplifies the b(x) to reduce the encoding time. The BCH parity check code encoder 10 of the present invention simplifies the parity check bit b(x) after the $8^{th}$ cycle to one cycle as following:

$$b_x(i)=b_x(i-8)+g(i-7)k_0+g(i-6)k_1+g(i-5)k_2+g(i-4)k_3+g(i-3)k_4+g(i-2)k_5+g(i-1)k_6+g(i)k_7 \quad (4\text{-}2)$$

where i=1 to 51.

The "+" is a modulo-2 addition, which can be realized with a plurality of XOR gates. Based on the above equations (4-1) and (4-2), a constant polynomial k(x) can be simplified as follows:

$$\because k_0=b_x(51)+u(7), g(51)=0$$

$$\therefore k_1=b_x(50)+g(51)k_0+u(6)=b_x(50)+u(6) \quad (4\text{-}3)$$

Similarly, $$k_2=b_x(49)+g(50)k_0+u(5)$$

$$k_3=b_x(48)+g(50)k_1+u(4)$$

$$k_4=b_x(47)+g(50)k_2+u(3)$$

$$k_5=b_x(46)+g(50)k_3+u(2)$$

$$k_6=b_x(45)+g(46)k_0+g(50)k_4+u(1)$$

$$k_7=b_x(44)+g(46)k_1+g(50)k_5+u(0) \quad (4\text{-}4)$$

And, based on equations (4-1), (4-2), (4-3) and (4-4):

$$b_x(7)=b_x(51)+u(7)+g(1)k_1+g(3)k_3+g(5)k_5+g(7)k_7$$

$$b_x(6)=b_x(50)+u(6)+g(1)k_2+g(3)k_4+g(5)k_6$$

$$b_x(5)=b_x(49)+g(50)k_0+u(5)+g(1)k_3+g(3)k_5+g(5)k_7$$

$$b_x(4)=b_x(48)+g(50)k_1+u(4)+g(1)k_4+g(3)k_6$$

$$b_x(3)=b_x(47)+g(50)k_2+u(3)+g(1)k_5+g(3)k_7$$

$$b_x(2)=b_x(46)+g(50)k_3+u(2)+g(1)k_6$$

$$b_x(1)=b_x(45)+g(46)k_0+g(50)k_4+u(1)+g(1)k_7$$

$$b_x(0)=b_x(44)+g(46)k_1+g(50)k_5+u(0)=k_7 \quad (4\text{-}5)$$

Based on equations (4-3), (4-4), and (4-4), it is clear that the BCH parity check code encoder 10 of the present invention can be realized with a plurality of OXR gates, and encoding time is reduced from the original 4096 cycles to 512 cycles.

The channel 20 is connected to the BCH parity check code encoder 10 to compute the 8-bit message u(x) and 52-bit parity check bits b(x) into a receiving data r(x).

Figure 3:
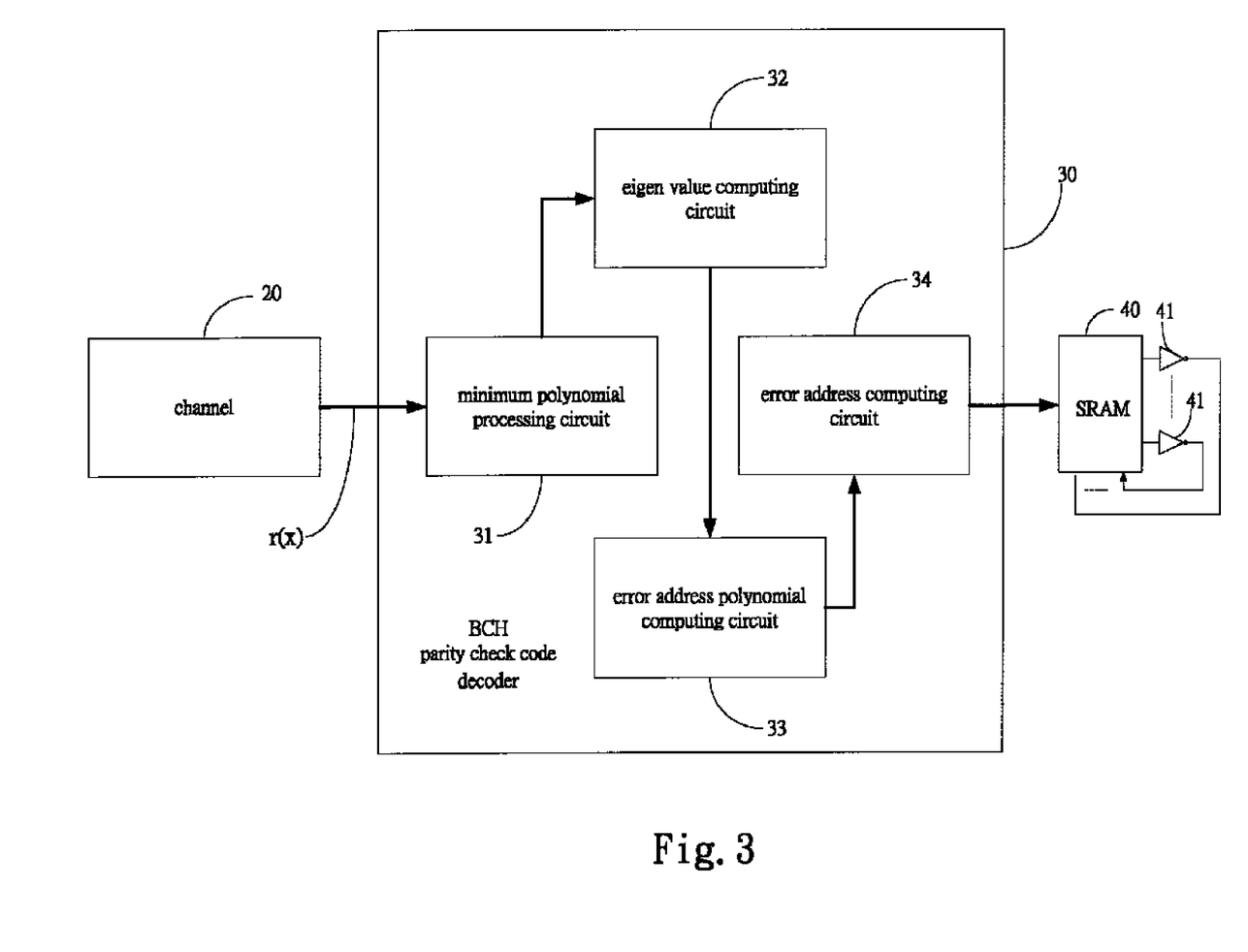
FIG. 3 shows a detailed block diagram of BCH parity check code decoder of the present invention.

Also referring to FIG. 3, the BCH parity check code decoder 10 includes a minimum polynomial processing circuit 31, an eigen value computing circuit 32, an error address polynomial computing circuit 33, and an error address computing circuit 34. The minimum polynomial processing circuit 31 is connected to the channel 20 for simplifying the parity check bits b(x) to reduce from 8 cycles to 1 cycle.

Eigen value $S=r\cdot H^T$ \quad (5-1)

Receiving data r(x) can be expressed as:

$$r(x)=a_i(x)\phi_i\phi_i(x)+b_i(x) \quad (5\text{-}2)$$

When the minimum polynomial $\phi_i=0$, the following equation can be obtained:

$$S=r(\alpha^i)=b(\alpha^i)=b_0+b_1\alpha+\ldots b_{n-1}\alpha^{(n-1)} \quad (5\text{-}3)$$

Based on above computation, the BCH(8191, 8139) decoding polynomial is:

Original polynomial: $P(x)=1+x+x^3+x^4$ \quad (5-31)

BCH decoded generator polynomial:

$$g(x)=LCM((\phi_1(x),\phi_3(x),\phi_5(x)\phi_7(x)) \quad (5\text{-}4)$$

The minimum polynomial:

$$\phi_1(x)=1+x+x^3+x^4+x^{13}$$

$$\phi_3(x)=1+x^4+x^5+x^7+x^9+x^{10}+x^{13}$$

$$\phi_5(x)=1+x+x^4+x^7+x^8+x^{11}+x^{13}$$

$$\phi_7(x)=1+x+x^2+x^3+x^6+x^8+x^9+x^{10}+x^{13}$$

Figure 4:
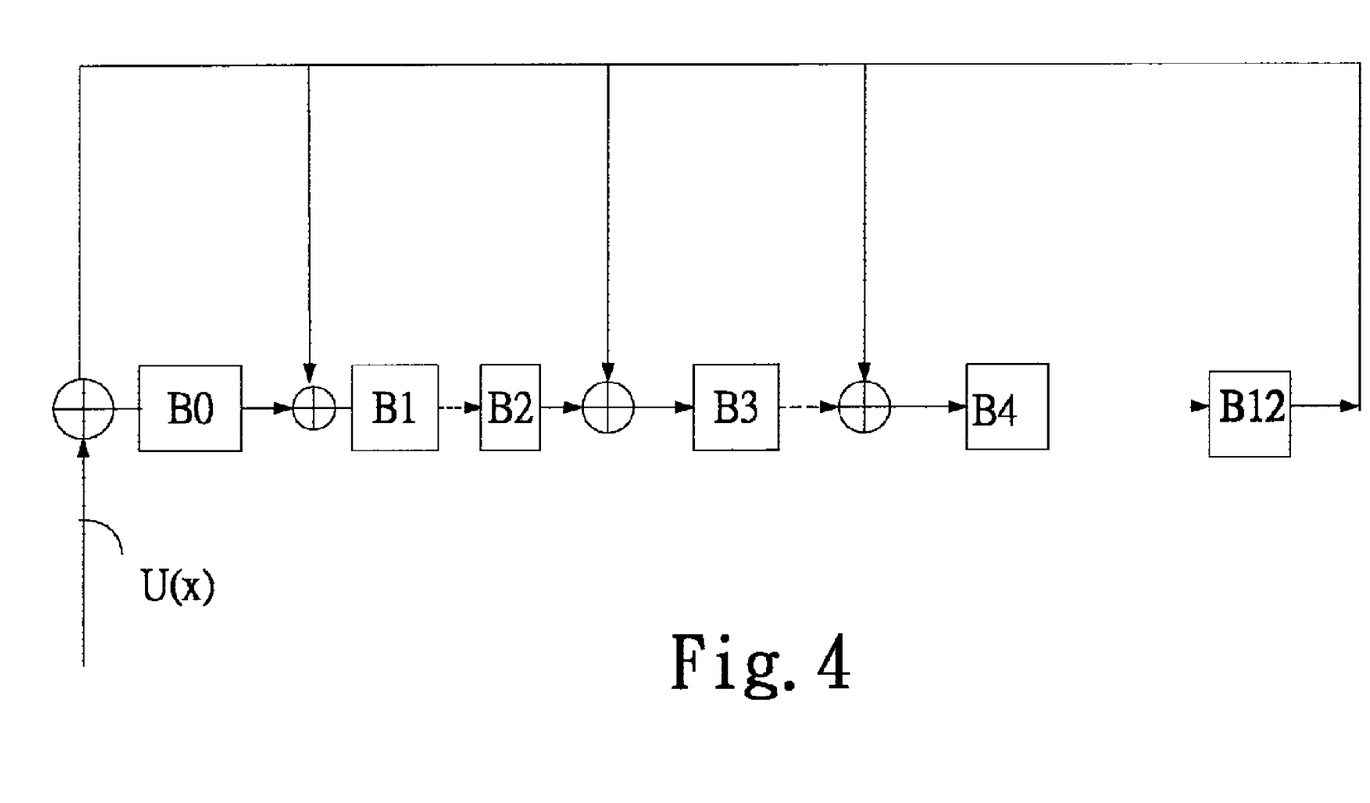
FIG. 4 shows a simplified parity check code bit circuit.

The following description refers to FIG. 4. The minimum polynomial $\phi_1(x)=1+x+x^3+x^4+x^{13}=0$ is used to simplify parity check bits b(x), where:

$$b_{12}(8)=b_4(0)$$

$$b_{11}(8)=b_4(1)=b_3(0)+b_{12}(0)$$

$$b_{10}(8)=b_4(2)=b_3(1)+b_{12}(1)=b_2(0)+b_{12}(0)+b_{11}(0) \quad (5\text{-}5)$$

Using the similar computation, the following can be obtained:

$$b_9(8)=b_4(3)=b_1(0)+b_{11}(0)+b_{10}(0)$$

$$b_8(8)=b_4(4)=b_0(0)+b_{12}(0)+b_{10}(0)+b_9(0)$$

$$b_7(8)=b_4(5)=u(0)+b_{12}(0)+b_{11}(0)+b_9(0)+b_8(0)$$

$$b_6(8)=b_4(6)=u(1)+b_{11}(0)+b_{10}(0)+b_8(0)+b_7(0)$$

$$b_5(8)=b_4(4)=u(2)+b_{10}(0)+b_9(0)+b_7(0)+b_6(0)$$

$$b_4(8)=u(3)+b_9(0)+b_8(0)+b_6(0)+b_5(0)$$

$$b_3(8)=u(4)+b_8(0)+b_7(0)+b_5(0)$$

$$b_2(8)=u(5)+b_7(0)+b_6(0)$$

$$b_0(8)=u(6)+b_6(0)+b_5(0)$$

$$b_0(8)=u(7)+b_5(0) \quad (5\text{-}6)$$

Where message u(x) is the data read from flash memory, and the "+" in (5-5), (5-6) is "modulo-2 addition". Similarly, when the minimum polynomial $$\phi_3(x)=1+x^4+x^5+x^7+x^9+x^{10}+x^{13}=0$$

$$\phi_5(x)=1+x+x^4+x^7+x^8+x^{11}+x^{13}=0$$

$$\phi_7(x)=1+x+x^2+x^3+x^6+x^8+x^9+x^{10}+x^{13}=0$$

the circuit of parity check bits b(x) of FIG. 4 can be found. The "+" between the parity check bits B0-B12 is "modulo-2 addition", and can be realized by XOR gates. Modulo-2 addition is performed on message u(x) and parity check bit unit B0 to reduce the circuit from the original 8 cycles to 1 cycle.

The eigen value computing circuit 32 is connected to the minimum polynomial processing circuit 31 to compute the following 8 eigen values:

$$S_1=r(\alpha)=b(\alpha)=b_0+b_1\alpha+\ldots+b_{12}\alpha^{12}$$

$$S_2=r(\alpha^2)=b(\alpha^2)=b_0+b_1\alpha^2+\ldots+b_{12}\alpha^{24}$$

$$S_3=r(\alpha^3)=b(\alpha^3)$$

$$S_4=r(\alpha^4)=b(\alpha^4)$$

$$S_5 = r(\alpha^5) = b(\alpha^5)$$

$$S_6 = r(\alpha^6) = b(\alpha^6)$$

$$S_7 = r(\alpha^7) = b(\alpha^7)$$

$$S_8 = r(\alpha^8) = b(\alpha^8) \quad (5\text{-}7)$$

The eigen values S1-S8 computed by the eigen value computing circuit 32 are used to determine the parity check. If all the eigen values S1-S8 are all zero, the data is correct, and the read of data can be continued. On the other hand, if the eigen values are not zero, the data is incorrect. The 512-bit eigen values S1-S8 can be obtained, and the correction capability is 4 bits.

The error address polynomial computing circuit 33 is connected to the eigen value computing circuit 32 for computing the error address polynomial if the eigen values S1-S8 are not zero. The computing of error address polynomial is based on the inversionless Berlekamp-Massey algorithm, as follows:

$$(1+S)V(k) = (1 + S_1 Z + \ldots + S_7 Z^7)(v_0 + v_1 Z + \ldots v_4 Z)$$

$$k=0 \to d^{(1)} = v_0 S_1 + v_1$$

$$k=1 \to d^{(3)} = v_0 S_3 + v_1 S_2 + v_2 S_1 + v_3$$

$$k=2 \to d^{(5)} = v_0 S_5 + v_1 S_4 + v_2 S_3 + v_3 S_2 + v_4 S_1$$

$$k=3 \to d^{(7)} = v_0 S_7 + v_1 S_6 + v_2 S_5 + v_3 S_4 + v_4 S_3$$

$$k=4 \to \text{finish} \quad (5\text{-}12)$$

Based on (5-12), the error address polynomial computing circuit 33 includes a 13-bit adder and a 13-bit multiplier.

The error address computing circuit 34 is connected to the error address polynomial computing circuit 33. Based on equation (5-12), each bit is substituted in the following equation:

$$v(x) = v_0 + v_1 x + v_2 x^2 + v_3 x^3 + v_4 x^4 \quad (5\text{-}13)$$

where $x = \alpha^1$. Therefore, the error address computing circuit 34 includes a 13-bit adder and a 13-bit multiplier, and the adder and the multiplier can compute at different time.

The SRAM 40 is for storing address data with parity check error, and is connected to the error address computing circuit 34 of BCH parity check code decoder 30. If the degree of encoding vector V(x) is equal to the degree of the error address polynomial of equation (5-12), the next task is to find the error address, and the data of the error address is read from the SRAM 40, corrected by a plurality of inverters 41, and written back to the SRAM 40. Thus, the parity check and correction is accomplished. The correction capability is 4 bits, and the flash memory can read the next piece of data. On the other hand, if the degree of encoding vector V(x) is not equal to the degree of the error address polynomial of equation (5-12), an error has occurred, and correction is impossible. Hence, an error message is issued.

Figure 5:
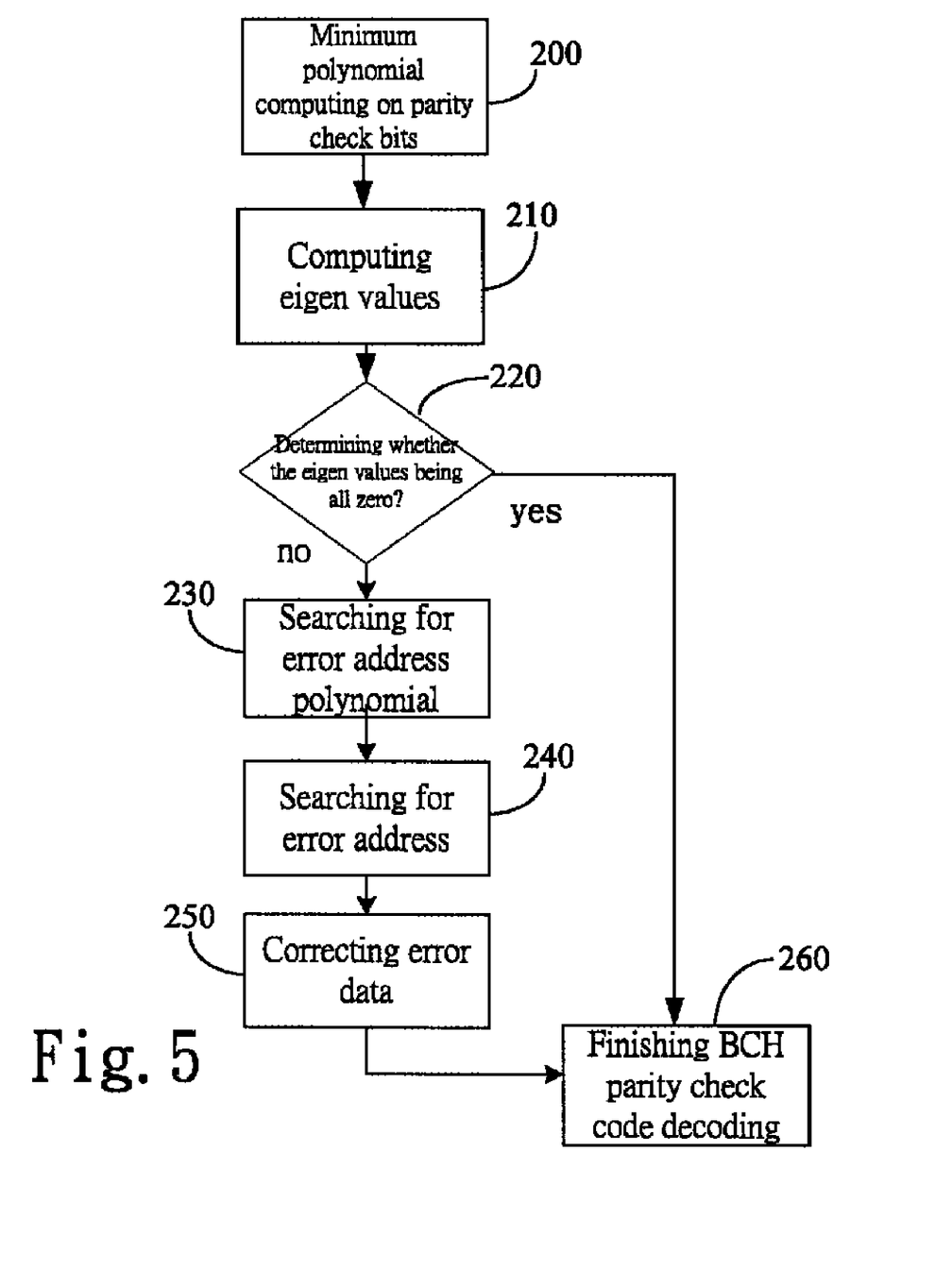
FIG. 5 shows a flowchart of the decoding process of the present invention.

FIG. 5 shows the flowchart of the decoding process of the BCH parity check code decoder 30 of the present invention, including the following steps:

(200) Minimum polynomial computing on parity check bits, for the minimum polynomial processing circuit 31 to perform minimum polynomial simplification on parity check bits b(x);

(210) Computing eigen values, for the eigen value computing circuit 32 to compute the eigen values S1-S8 based on b(x) of step (200);

(220) Determining whether the eigen values of step (210) being all zero, if not, proceed to step 230, otherwise, proceed to step 260;

(230) Searching for error address polynomial, for the error address polynomial computing circuit 33 to compute error address polynomial when S1-S8 are all non-zero, indicating an error in writing data;

(240) Searching for error address, for the error address computing circuit 34 to compute the error address based on the error address polynomial of step (230);

(250) Correcting error data, by reading error data from the SRAM, correcting error data, and storing corrected data back to the SRAM; and (260) Finishing BCH parity check code decoding.

Figure 6:
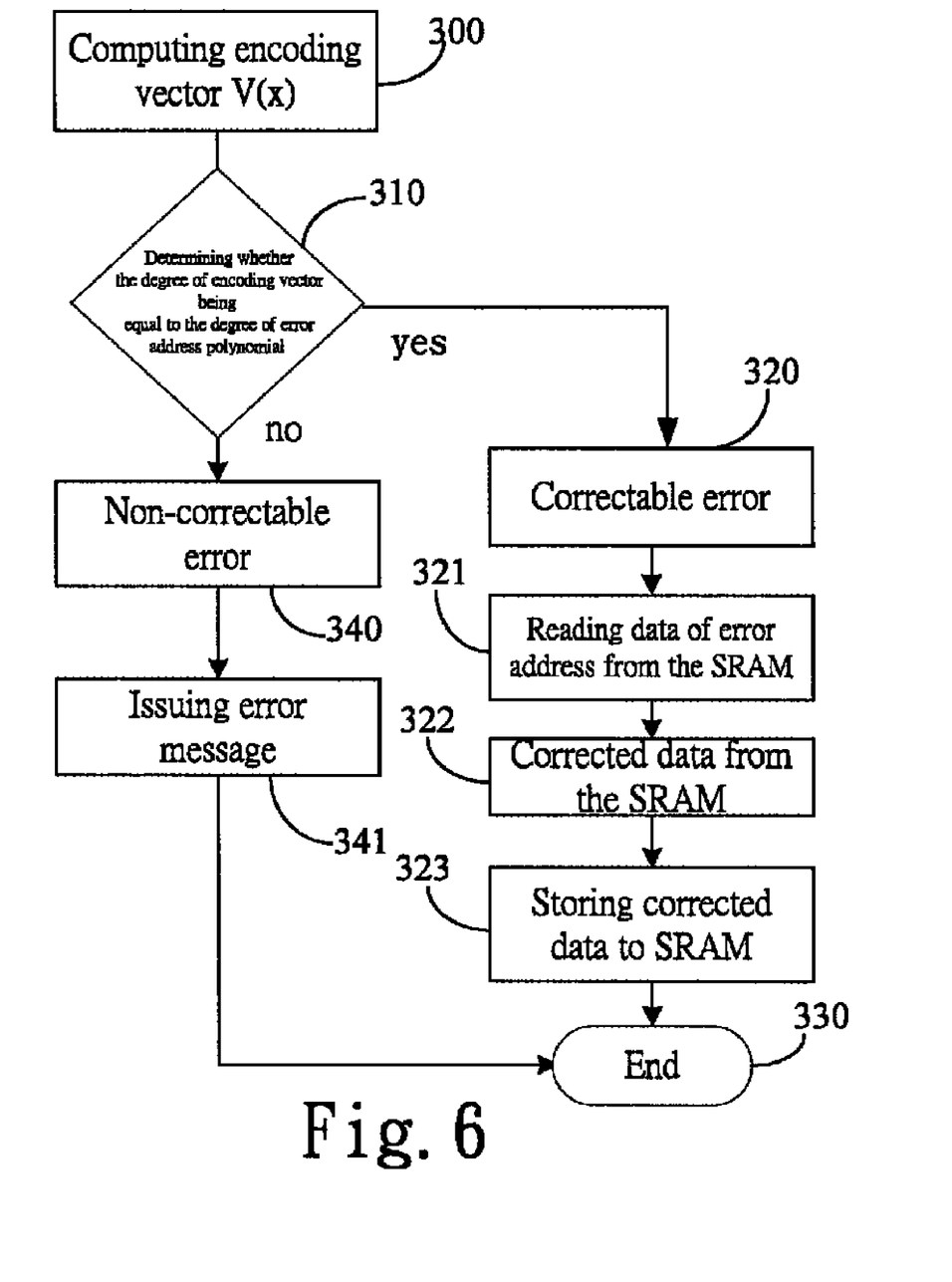
FIG. 6 shows a flowchart of the error address detection and data correction process of the error address computing circuit and the SRAM of the present invention.

FIG. 6 shows the flowchart of the parity check error address and correction process of the error address computing circuit 34 of the BCH parity check code decoder 30 and the SRAM 40 of the present invention, including the following steps:

(300) Computing encoding vector V(x), for the error address computing circuit 34 to compute encoding vector V(x);

(310) Determining whether the degree of encoding vector being equal to the degree of error address polynomial, for the error address computing circuit 34 to determine whether the degree of encoding vector is equal to the degree of error address polynomial, if so, proceed to step (320), otherwise, proceed to step (340);

(320) Correctable error, the error address computing circuit 34 identifying as a correctable error;

(321) Reading data of error address from the SRAM, by reading data at error address computed by the error address computing circuit 34 from the SRAM 40;

(322) Corrected data from the SRAM, by correcting data from step (321) with the inverter 41;

(323) Storing corrected data to SRAM, by storing corrected data in step (322) to the SRAM 40; and accomplishing data parity check and correction;

(330) End;

(340) Non-correctable error, the error address computing circuit 34 identifying as a non-correctable error; and (341) Issuing error message, for the error address computing circuit 34 to issue an error message and retuning to step (330).

The apparatus for random parity check and correction with BCH code of the present invention has the following advantages:

(1) The parity check code encoding time and eigen value computing time are reduced from 4148 cycles to 528 cycles;

(2) The BCH parity check code encoder 10 and the BCH parity check code decoder 30 are simplified in hardware design, and the cost is reduced; and (3) The hardware circuit reaches 8-bit random parity check on 512-bit data and random 4-bit correction capability.

While the invention has been described in connection with what is presently considered to the most practical and preferred embodiment, it is to be understood that the invention is not to be limited to the disclosed embodiment, but on the contrary, is intended to cover various modifications and equivalent arrangement included within the spirit and scope of the appended claims.

What is claimed is:

1. An apparatus for random parity check and correction with BCH code, comprising:
    a Bose-Chaudhuri-Hocquenghem (BCH) parity check code encoder, for using BCH encoding to encode parity check code and outputting parity check code bits;

a channel, connected to the BCH parity check code encoder, for computing a message of data writing to a flash memory and the parity check code bits from the BCH parity check code encoder into a receiving data, and outputting the receiving data;

a BCH parity check code decoder, connected to the channel, for receiving the receiving data and the parity check code bits from the channel, using BCH decoding to compute parity check code minimum polynomial, eigen values, error address polynomial and error address, outputting the error address; and a static random access memory (SRAM), connected to the BCH parity check code decoder, and storing error data of the flash memory, for correcting the error data based on the error address from the BCH parity check code decoder.

2. The apparatus as claimed in claim 1, wherein the parity check code bits of the BCH parity check code encoder are computed by a plurality of XOR gates.

3. The apparatus as claimed in claim 1, wherein the BCH parity check code decoder further comprises:

a minimum polynomial processing circuit, connected to the channel for simplifying the parity check code bits;

an eigen value computing circuit, connected to the minimum polynomial computing circuit, for computing a plurality of eigen values based on the simplified parity check code bits;

an error address polynomial computing circuit, connected to the eigen value computing circuit, for computing an error address polynomial when the eigen values from the eigen value computing circuit is non-zero; and an error address computing circuit, connected to the error address polynomial computing circuit, for computing an error address based on the error address polynomial from the error address polynomial computing circuit.

4. The apparatus as claimed in claim 3, wherein the error address polynomial computing circuit comprises a 13-bit adder and a 13-bit multiplier.

5. The apparatus as claimed in claim 3, wherein the error address computing circuit comprises a 13-bit adder and a 13-bit multiplier.

6. The apparatus as claimed in claim 1, wherein the SRAM are connected to a plurality of inverters.

* * * * *